United States Patent [19]

Widmayer

[11] Patent Number: 5,582,240
[45] Date of Patent: Dec. 10, 1996

[54] PNEUMATICALLY COUPLED HEAT SINK ASSEMBLY

[75] Inventor: Robert B. Widmayer, Harvard, Ill.

[73] Assignee: Motorola, Inc., Schaumburg, Ill.

[21] Appl. No.: 308,316

[22] Filed: Sep. 19, 1994

[51] Int. Cl.⁶ ........................................ F28F 7/00
[52] U.S. Cl. .......... 165/80.3; 257/722; 361/697; 361/703; 165/185
[58] Field of Search ................. 165/185, 121, 165/80.3, 174, 104.33, 124; 257/722; 361/710, 703, 697, 694, 711

[56] References Cited

U.S. PATENT DOCUMENTS

| 2,730,663 | 1/1956 | Harty | 165/80.3 X |
| 2,965,819 | 12/1960 | Rosenbaum | 165/80.3 X |
| 3,280,907 | 10/1966 | Hoffman | 165/80.3 X |
| 3,312,277 | 4/1967 | Chitouras et al. | 165/80.3 X |
| 3,592,260 | 7/1971 | Berger | 165/121 |
| 3,955,122 | 5/1976 | Maynard et al. | 165/80.3 X |
| 4,682,651 | 7/1987 | Gabuzda | 165/80.3 |
| 4,753,290 | 6/1988 | Gabuzda | 257/722 X |
| 4,823,869 | 4/1989 | Arnold et al. | 165/185 |
| 5,077,601 | 12/1991 | Hatada et al. | 165/80.3 X |
| 5,194,935 | 3/1993 | Kitano et al. | 257/722 X |
| 5,195,576 | 3/1993 | Hatada et al. | 165/185 X |
| 5,329,436 | 7/1994 | Chiu | 165/185 X |
| 5,368,094 | 11/1994 | Hung | 165/80.3 |
| 5,455,457 | 10/1995 | Kurokawa | 361/711 X |

FOREIGN PATENT DOCUMENTS

| 5048282 | 2/1993 | Japan | 361/703 |
| 1054001 | 1/1967 | United Kingdom | 165/184 |

Primary Examiner—John Rivell
Assistant Examiner—Christopher Atkinson
Attorney, Agent, or Firm—James A. Coffing; George C. Pappas

[57] ABSTRACT

A heat sink assembly (100) employs multiple heat sinks (401–403) that are juxtaposed to provide pneumatically coupled air flow pathways. At least one of the heat sinks (401) preferably includes an air circulator to force the air flow towards a periphery of the heat sink. A plurality of heat radiating surfaces provide pneumatic pathways (201) for the air flow, and at least two of the pneumatic pathways (201) are arranged substantially non-parallel. In this manner, the air is forced (i.e., when an air circulator is provided) radially from a center point of the heat sink (200) toward a periphery. Similarly, the air is directed (i.e., when an air circulator is not provided) toward a central locale from the periphery of the heat sink (300).

4 Claims, 2 Drawing Sheets

PNEUMATICALLY COUPLED HEAT SINK ASSEMBLY

FIELD OF THE INVENTION

This invention relates generally to heat sinks and, in particular, to heat sinks used in communication equipment.

BACKGROUND OF THE INVENTION

Radio communication systems that provide cellular and land mobile communication services are known in the art. Such systems comprise infrastructure equipment, which includes equipment located at one or more sites, and subscriber units, which include portable and mobile communication units. Typically, a variety of equipment is required at each site. Such equipment includes radio base stations that support communication channels. A base station includes a receiver and a transmitter, where the transmitter amplifies the signal before transmission. This amplification generates a significant amount of heat during operation due to the internal components of the transmitter. In many cases, if left uncontrolled, the heat generated can permanently damage these internal components.

To maintain a desirable operating temperature of the transmitter, it can be cooled in a variety of ways. One widely used method is forced air cooling, where the heat generating devices of the transmitter are mounted on a heat sink that comprises a mass of thermally conductive material, such as aluminum. The forced air is provided by a fan located adjacent to the heat sink. The heat generated by the device is conducted to the heat sink, where the air flow from the fan dissipates the heat to the ambient air. Relative to other methods of cooling, such as liquid cooling, forced air cooling offers an economical solution that is relatively easy to incorporate in the design and manufacture of a base station.

As the transmit power of the base station increases, the heat generated also increases, and typically, larger heat sinks and more cooling fans are employed to dissipate the increased amount of heat. Larger heat sinks, however, afford less flexibility in system design and cost more to manufacture due to the handling difficulties during manufacture. To alleviate the need for larger heat sinks, multiple heat sinks can be aligned to dissipate the heat that is generated by the base stations. However, in prior art heat sinks, there is no pneumatic path provided for heat dissipation between juxtaposed heat sinks, thereby limiting their effectiveness.

Accordingly, a need exists for a heat sink assembly that is economical to manufacture and capable of providing greater heat dissipation without the disadvantages that are associated with large heat sinks.

DESCRIPTION OF A PREFERRED EMBODIMENT

Generally, the present invention provides a pneumatically coupled heat sink assembly that allows greater heat dissipation when multiple heat sinks are juxtaposed. This is accomplished through the use of pneumatic pathways being operably coupled with the pneumatic pathways of adjacent heat sinks. These pneumatic pathways are made through heat radiating surfaces that will have at least two of the pneumatic pathways being non-parallel. The non-parallel pneumatic pathways provide the ability for the air flow to be directed away from the air circulator toward the periphery of the heat sink. This allows the air to be then transferred to an adjacent heat sink that can assist in dissipating the heat.

Figure 1:
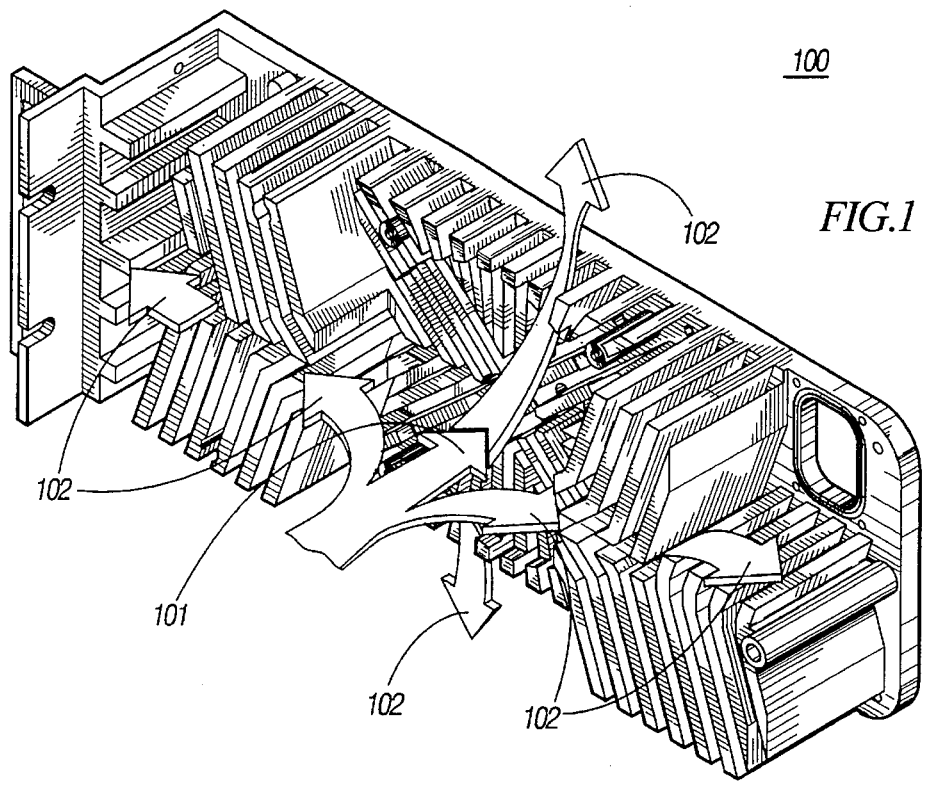
FIG. 1 illustrates an isometric view of a heat sink assembly in accordance with the present invention.

The present invention can be more fully described with reference to FIGS. 1–4. FIG. 1 illustrates an isometric view of a heat sink assembly 100. Air flow 101 represents a forced air flow from an air circulator, which in a preferred embodiment is a fan, mounted to heat sink 100. The fan generates a first air flow 101, which flows substantially perpendicular to the convective surface. When air flow 101 is directed towards heat sink 100, it is directed into the air flow paths 102. The air flow paths 102 are pneumatic pathways which run substantially parallel to the convective surface and are directed through the heat radiating surfaces toward the periphery of the heat sink 100. The air flow can then be dissipated to the ambient air or pneumatically passed to an adjacent heat sink, as later described.

Figure 2:
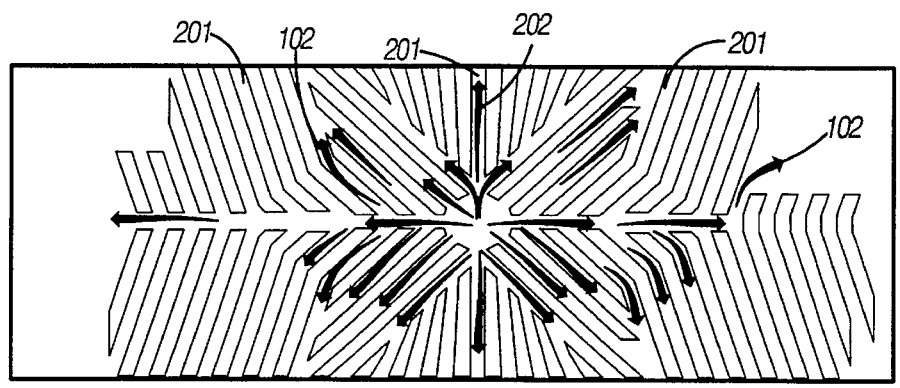
FIG. 2 illustrates a view of the air flow from an air circulator in accordance with the present invention.

FIG. 2 illustrates a view of the forced air flow through heat sink assembly 200. Pneumatic pathways 201 are formed throughout the heat sink assembly by heat radiating surfaces, such as heat fins. Air flow 202 represents air flow that has been directed from the area of the air circulator towards the periphery of heat sink 200 through pneumatic pathway 201. This air flow could then be passed to an adjacent heat sink, such as the heat sink represented in FIG. 3.

Figure 3:
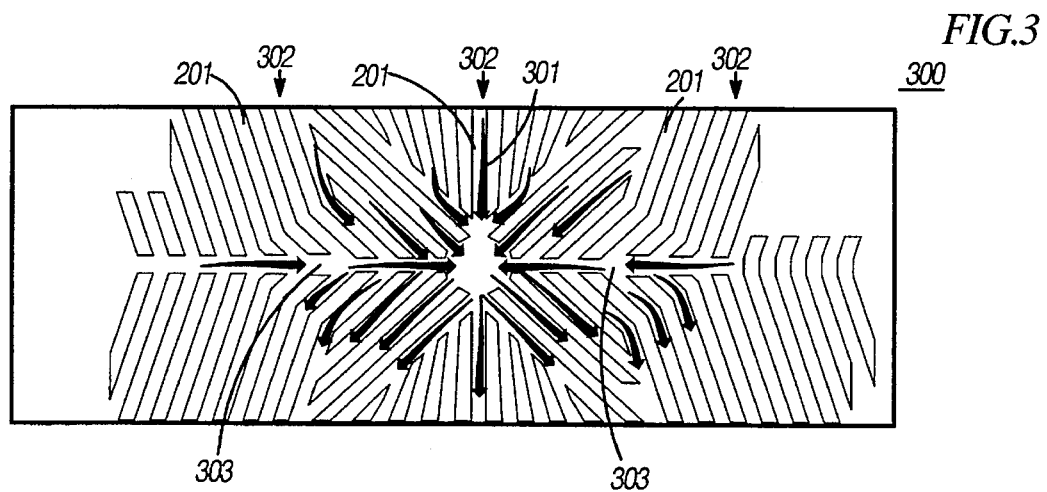
FIG. 3 illustrates a view of the air flow from an adjacent heat sink in accordance with the present invention.

FIG. 3 illustrates a view of air flow through heat sink assembly 300. As with heat sink assembly 200, pneumatic pathways 201 are formed between heat radiating surfaces of the heat sink. Air flows 302 are air flows that could originate from an adjacent heat sink. Air flow 301 represents the air flow through heat sink 300, away from the periphery of the convective base surface. These air flows 301 are then dispersed throughout other pneumatic pathways of the heat sink 300 via, e.g., traversing pneumatic pathways 303, as shown. In this manner, the air is permitted to flow throughout the heat radiating surfaces of the heat sink for improved heat dissipation.

Figure 4:
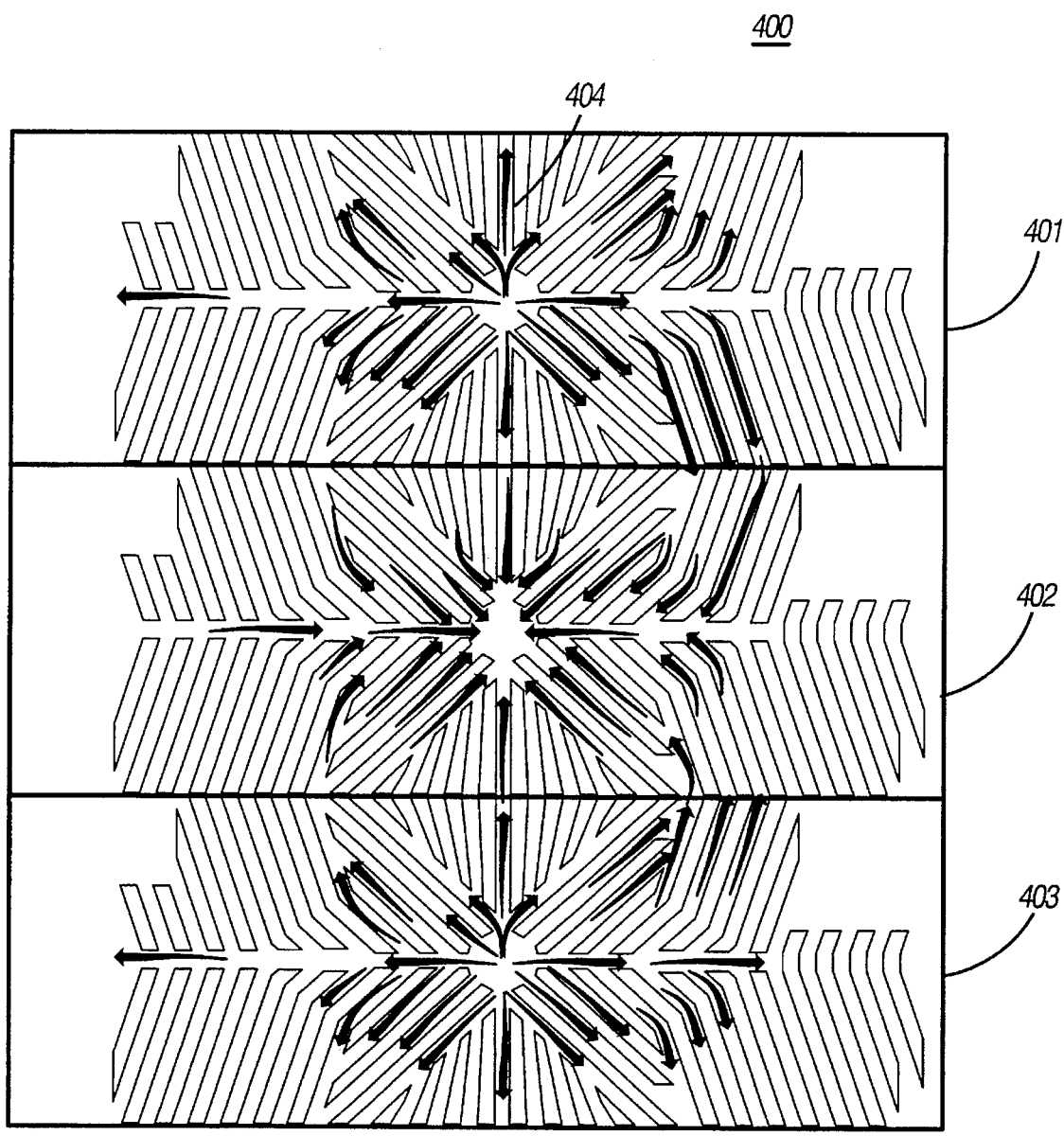
FIG. 4 illustrates a view of the air flow within three adjacent heat sinks in accordance with the present invention.

FIG. 4 shows a heat sink assembly 400 that includes three heat sinks (401, 402, and 403) arranged in a pattern according to the present invention. In a preferred embodiment, heat sinks 401 and 403 include air circulators that force air through the heat radiating surfaces of the heat sinks toward the periphery of the heat sinks. Heat sink 402 represents a heat sink without an air circulator. Heat sink 402 will receive air flow from the periphery of heat sinks 401 and 403, and this air flow will be dispersed among the pneumatic pathways formed among the heat radiating surfaces of heat sink 402. The pneumatic pathways of the adjacent heat sinks are aligned such that they will be pneumatically coupled to produce an increased ability to dissipate heat. In a preferred embodiment, the heat sinks will be aligned so as to minimize the restriction of air flow between adjacent heat sinks. However, the adjacent heat sinks do not need to be perfectly aligned to produce an increased degree of heat dissipation.

As long as at least two of the pneumatic pathways are at least partially pneumatically coupled, there will be an increase in the heat dissipative ability of the heat sink assembly.

The present invention provides an increased ability to dissipate heat by juxtaposing multiple heat sinks. The heat sinks can include air circulators, such as fans, or they can dissipate heat into the ambient air, as is known in the art. They can also dissipate the heat generated by adjacent heat sinks and passed through pneumatic pathways that couple the heat sinks.

A heat sink assembly in accordance with the present invention is economical to manufacture and capable of providing greater heat dissipation without the disadvantages that are associated with large heat sinks. Correspondingly, the present invention will be more economical to manufacture and will provide greater heat dissipation, along with providing the ability to increase the heat dissipation of a heat sink assembly without having to replace a smaller heat sink with a larger heat sink. The present invention also allows the flexibility to use multiple heat sinks where currently only large, less economical heat sinks can be used.

What is claimed is:

1. A heat sink assembly for use with a heat generating device comprising:

a first heat sink including a first convective surface and a first plurality of heat radiating surfaces formed on the first convective surface, at least three of the first plurality of heat radiating surfaces forming at least two non-parallel pneumatic pathways; and a second heat sink including a second convective surface and a second plurality of heat radiating surfaces formed on the second convective surface, at least three of the second plurality of heat radiating surfaces forming at least two non-parallel pneumatic pathways, wherein the first and second heat sinks are juxtaposable and positionable atop the heat generating device so as to pneumatically couple the at least two non-parallel pneumatic pathways of the first heat sink to the at least two non-parallel pneumatic pathways of the second heat sink.

2. The heat sink assembly of claim 1, and further comprising a traversing pneumatic pathway formed through at least the first plurality of heat radiating surfaces, thereby pneumatically inter-coupling the at least two non-parallel pneumatic pathways of the first heat sink.

3. A heat sink assembly for use with a heat generating device comprising:

a first and second heat sinks each including:

a convective surface; and a plurality of heat radiating surfaces extending outwardly from the convective surface forming a plurality of pneumatic pathways arranged in a predetermined pattern, whereby when the first and second heat sinks are juxtaposed and positioned atop the heat generating device, the plurality of pneumatic pathways of the first heat sink are pneumatically coupled to the pneumatic pathways of the second heat sink, with at least one common periphery, and whereby when air flows toward the first heat sink from above the heat radiating surfaces of the first heat sink, air flow is directed through the pneumatic pathways of the first heat sink, and via the at least one common periphery, through the pneumatic pathways of the second heat sink.

4. A method of dissipating heat from a heat generating device using a first and second heat sinks, each heat sink including a convective surface and a plurality of heat radiating surfaces extending outwardly from the convective surface forming a plurality of non-parallel pneumatic pathways, the method comprising the steps of:

juxtaposing the first and second heat sinks atop the heat generating device to pneumatically couple the plurality of non-parallel pneumatic pathways of the first heat sink to the plurality of non-parallel pneumatic pathways of the second heat sink, via at least one common periphery; and orienting the juxtaposed heat sinks such that air is directed from atop the first heat sink through the plurality of non-parallel pneumatic pathways of the first heat sink, and via the at least one common periphery, through the pneumatic pathways of the second heat sink.

\* \* \* \* \*